United States Patent [19]
Linde et al.

[11] Patent Number: 5,503,961
[45] Date of Patent: Apr. 2, 1996

[54] PROCESS FOR FORMING MULTILAYER LIFT-OFF STRUCTURES

[75] Inventors: Harold G. Linde; Rosemary A. Previti-Kelly, both of Richmond; Thomas J. Reen, Essex Junction, all of Vt.

[73] Assignee: International Business Machines Corporation, Armonk, N.Y.

[21] Appl. No.: 333,404

[22] Filed: Nov. 2, 1994

[51] Int. Cl.$^6$ ............................................. G03F 7/26
[52] U.S. Cl. .................... 430/315; 430/313; 430/224; 430/329
[58] Field of Search ........................... 430/313, 315, 430/324, 329, 394

[56] References Cited

U.S. PATENT DOCUMENTS

| | | | |
|---|---|---|---|
| 4,533,624 | 8/1985 | Sheppard | 430/315 |
| 4,606,998 | 8/1986 | Clodgo et al. | 430/312 |
| 5,006,488 | 4/1991 | Previti-Kelly | 437/229 |
| 5,229,257 | 7/1993 | Cronin | 430/324 |
| 5,266,446 | 11/1993 | Chang | 430/315 |

*Primary Examiner*—Kathleen Duda
*Attorney, Agent, or Firm*—Heslin & Rothenberg

[57] ABSTRACT

A process is disclosed for forming multilayered polyimide structure from negative photosensitive polyimide precursors. An initial polyimide layer is deposited and imagewise exposed. The unexposed portions of the initial polyimide layer are inhibited and then a second polyimide layer is deposited and likewise imagewise exposed. The films are developed, thereby forming a multilayer polyimide structure. After formation of the multilayer polyimide structure, a conductive material is applied on a substrate and then the polyimide layers are lifted off thereby forming a desired pattern of metallization.

25 Claims, 2 Drawing Sheets

PROCESS FOR FORMING MULTILAYER LIFT-OFF STRUCTURES

TECHNICAL FIELD

The invention relates to a method for forming multilayer lift-off structures and more particularly to forming multilayer lift-off structures with negative photosensitive polyimide films and also to an improved lift-off process for forming a metallization pattern.

BACKGROUND

In the fabrication of semiconductor devices it is often desirable not only to form patterned conductive layers but to do so such that the conductive layer has a shape which enhances electrical contact. For example, rounded chip pads (i.e. "solder balls") enhance electrical contact with other metallization levels. Although there are many known methods for forming a patterned conductor layer on a substrate the two most common methods of forming such a layer are subtractive etching and lift-off techniques. In subtractive etching, after a blanket conductor layer is deposited on the substrate the layer is selectively etched in order to remove undesired portions thereof. In lift-off, a layer (typically an insulator such as a polyimide or a photoresist) is deposited on a substrate, and is patterned through a photomask. The conductive layer is then deposited on the patterned insulator and the insulator is removed from (i.e. "lifted off" of) the substrate, taking with it the undesired portions of the conductive layer. Of these two techniques, it has been found that lift-off is more desirable since the solvents used to remove the insulator in lift-off cause less damage to the underlying substrate than do the etch processes (e.g. a plasma etch or a reactive ion etch) used in subtractive etching. Also, the conductor profile resulting from lift-off processing minimizes step coverage problems in subsequent conductor layers.

Utilization of lift-off techniques is already a preferred method of forming patterned conductive layers and, thus, it would be of considerable advantage if these same techniques could be utilized in order to form patterned conductive layers having varied shapes, such as "solder balls". However, creation of such conductive layers would often require the use of more complex lift-off structures and multiple layers of imaged lift-off (polyimide) layers.

An exemplary lift-off process involves coating a substrate with a photosensitive polyimide, imagewise exposing and then developing the layer so as to expose selected portions of the substrate. Then a conductive material is applied to form a film across portions of the remaining polyimide layer as well as the exposed portions of the substrate. The remaining portion of the polyimide layer is then "lifted off" taking with it the undesired portions of the metal layer leaving only the desired pattern of conductive material on the substrate. See, for example, U.S. Pat. No. 5,006,488 issued to Previti-Kelly on Apr. 9, 1991, the contents of which are incorporated herein by reference. However, the process discussed in the Previti-Kelly '488 patent utilizes only a single polyimide layer and is mainly dedicated to solving problems associated with depositing a metallization layer at high temperatures and avoiding the use of protective barrier layers during photolithographic processing.

The use of multiple layers of polyimides with lift-off techniques was described in an article by Winter, "Metal Deposition with Polyimide Lift-off Technique", IBM Technical Disclosure Bulletin, Vol. 17, No. 5, October 1974, page 1309, in which a first layer of polyimide is patterned through a photoresist mask. After the metal is deposited, the photoresist mask is removed from the first polyimide layer and a second polyimide layer is applied for passivation.

U.S. Pat. No. 4,606,998 issued Clodgo et al. on Aug. 19, 1986 describes a method utilizing multiple polyimide layers in a lift-off structure compatible with high temperature metal deposition. In the Clodgo '998 patent, an initial polyimide layer is deposited upon the substrate followed by deposition of a second layer of high temperature polyimide upon the surface of the initial polyimide layer. Both polyimide layers are then heated to a temperature which is below the final curing temperature of the high temperature polyimide and above the final curing temperature of the initial polyimide layer. This will allow the high temperature polyimide layer to remain soluble in common developers while the initial polyimide layer, which is fully imidized, becomes substantially insoluble in common solvents. Photoresist is then applied, exposed and developed and the two polyimide layers are etched forming a via which exposes the substrate. Conductive material is then deposited across the device, namely upon the second polyimide layer and the exposed substrate. Finally, the high temperature polyimide layer (the second layer) is then lifted off taking with it the undesired portions of the conductive layer while leaving the patterned conductive layer and the initial polyimide layer which serves to passivate the conductive layer. Although multiple layers of polyimide are used with this process it is, like the others, directed towards solving the problem of providing a lift-off structure compatible with a high temperature metal deposition without the use of a barrier layer. These prior patents, although solving important problems related to the formation of patterned metallization layers using photosensitive polyimide films, do not deal with problems experienced when it is desirable to separately image and develop overlapping layers of photosensitive polyimide materials.

The problems experienced with creating overlapping noncongruous layers of photosensitive polyimide become readily apparent upon understanding the properties of negative acting resists. With negative acting photosensitive polyimide resists it is the unexposed (uncross-linked) portions of the layer which are initially removed to create the desired pattern. For example, when a negative acting photosensitive polyimide precursor is exposed to a predetermined pattern of radiation, such as UV light, the exposed portions undergo cross-linking, making them insoluble in a developer. Thus, upon application of the developer the unexposed (non-cross-linked) polyimides are selectively removed, creating a desired pattern for depositing a subsequent conductive film. Accordingly, imagewise exposing and developing multiple layers having incongruous patterns is problematic since activating energy passes through the second layer and causes cross-linking in the underlying (previously unexposed) polyimide layer. Thus, portions of the initial layer, which were intended to be removed by the developer, have now become insoluble due to exposure (cross-linking) to the activating energy. This has the effect of altering or destroying the desired pattern to be formed by the initial layer.

Thus, there exists a need for a method of forming multilayer lift-off structures and a method of forming a patterned conductive layer having complex configurations.

SUMMARY OF THE INVENTION

The present invention encompasses, in one aspect, a process for forming a multilayer polyimide structure comprising:

applying a first layer of negative photosensitive polyimide precursor on a substrate;

imagewise exposing said first layer;

inhibiting the unexposed portions of said first layer;

applying a second layer of photosensitive polyimide precursor over said first layer;

imagewise exposing said second layer, wherein an uncross-linked area of said second layer at least partially overlaps the inhibited portion of said first layer; and developing said first and second layers, thereby forming a multilayer polyimide structure.

In a further aspect of the invention, inhibiting the unexposed portion of the first layer may comprise incorporating a dye, such as [1-(2pyridylazo)-2-naphthol], into the unexposed portions of said first layer. Another aspect of the invention encompasses inhibiting the unexposed portion of the first layer by exposing said first layer to an oxidizing agent, examples being $I_2$, $Cl_2$ or $O_3$, such that the double bond functionality responsible for cross-linking is altered.

In a further aspect of the invention, a method for forming a pattern of conductive material on a processed semiconductor substrate, comprises:

applying a first layer of negative photosensitive precursor to said substrate, wherein said precursor is a material which fully imidizes at a temperature in excess of the temperature at which said conductive material is to be applied;

imagewise exposing said first layer;

inhibiting the unexposed portion of said first layer;

applying a second layer of negative photosensitive polyimide precursor over said first layer;

imagewise exposing said second layer, wherein the unexposed portion of said second layer at least partially overlaps said nonexposed portion of said first layer;

developing said unexposed and inhibited portions of said first and second layers thereby forming a void in said first and second layers;

applying a conductive material within said void; and lifting off said first and second layers.

The present invention further encompasses a multilayer structure having a contiguous cavity, comprising:

a semiconductor substrate;

a first layer comprising a negative photosensitive material wherein said first layer is positioned over said substrate and defines a first cavity;

a second layer comprising a photosensitive material wherein said second layer is positioned over said first layer wherein said second layer is positioned over said first layer and defines a second cavity that at least partially overlays the first cavity.

In a further aspect of the invention the entirety of the second cavity overlays the first cavity and the first and second cavities are cylindrically shaped with the first cavity having a larger radius than the second cavity.

DETAILED DESCRIPTION

Figure 1:
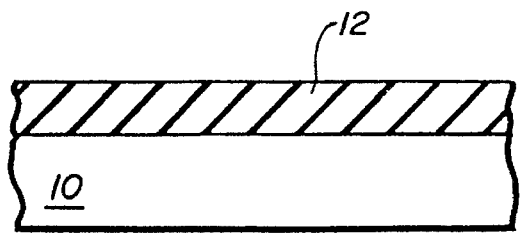
FIGS. 1–10 are cross sectional views of a semiconductor substrate and polyimide structure that result at various stages of the process of the present invention.

Referring to FIG. 1, the process starts by applying a layer of photosensitive polyimide precursor 12 to a processed semiconductor substrate 10. Preferably, the layer is applied at about 1000–6000 rpm for about 15–65 seconds and then baked at a temperature of about 70°–120° C. for about 10–30 minutes. Preferably the resulting film will have a thickness of 5μ or less. Actual conditions will vary, however, depending on a number of factors, such as, for example the desired thickness of the layer, the exact precursor material employed and so forth, as will be apparent to those skilled in the art.

While the substrate 10 is shown as being a bare silicon substrate, it is to be understood that any one of the semiconductor structures or devices currently manufactured in the industry (e.g. FET or bipolar transistors, storage capacitors, resistors, other active and passive electronic devices etc.), could be arranged on the substrate and that the patterned conductor layer to be described is patterned so as to form an electrical contact to any one or more of these structures. Substrate 10 is simply shown as being bare merely for the purposes of more clearly illustrating the present invention.

Numerous negative acting photosensitive polyimide precursor materials may be employed in accordance with the present invention. Preferably, the material is a photosensitive polyimide precursor which fully imidizes at a temperature in excess of the temperature in which the film of conductive material is formed, more preferably at least about 250°–280° C. In a preferred embodiment, the polyimide precursor material is a polyamic acrylate ester such as that commercially available under the trade name "PROBIMIDE" 300 series or 7000 series manufactured by OCG Corp., and having the formula

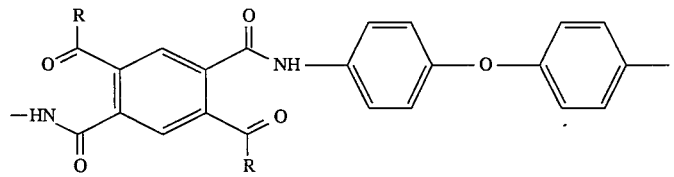

wherein R is

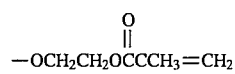

Such polyimide precursor materials are described more fully in Rohte, O. et al. "High Resolution, High Photo Speed Polyimide for Thick Film Applications", Solid State Technology (September 1986), the entire disclosure of which is incorporated herein by reference. Other suitable polyimide precursor materials are disclosed in Re. 30,186, issued to Rubner et al. on Jan. 8, 1980; U.S. Pat. No. 4,040,831 issued to Rubner et al. on Aug. 9, 1977; and U.S. Pat. No. 4,786,569 issued to Rohte et al. on Nov. 22, 1988, the entire disclosures of which are also incorporated herein by reference.

Preferably high temperature polyimides which do not fully imidize at temperatures below approximately 250°–280° C. are utilized, such as a polyimide like "PROBIMIDE" discussed above. Other examples of acceptable polyimide precursors include, but are not limited to, "PYRALIN" 2700 Series, sold by the DuPont Company of Wilmington, Del. "PYRALIN" is a trademark of the DuPont Company. Another such photosensitive polyimide is sold under the trade name "PL" by the Hitachi Chemical Company Ltd. of Japan.

Figure 2:
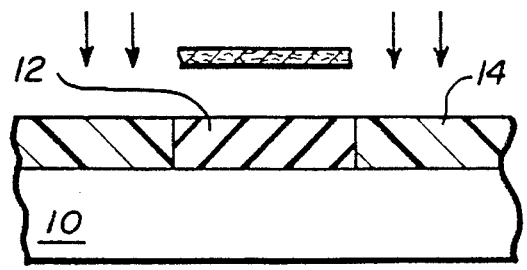

As may be seen in reference to FIG. 2, once applied to the substrate, the initial polyimide layer may be exposed in a predetermined pattern to radiation, such as UV light in a conventional fashion. The unexposed portions 12 of the negative polyimide precursor do not undergo cross-linking and, therefore, remain soluble in common developers. However, the exposed portions 14 of the polyimide precursor undergo cross-linking and become insoluble in common developers. For example, when using Probimide 349, exposure of the film to UV radiation results in the following reaction:

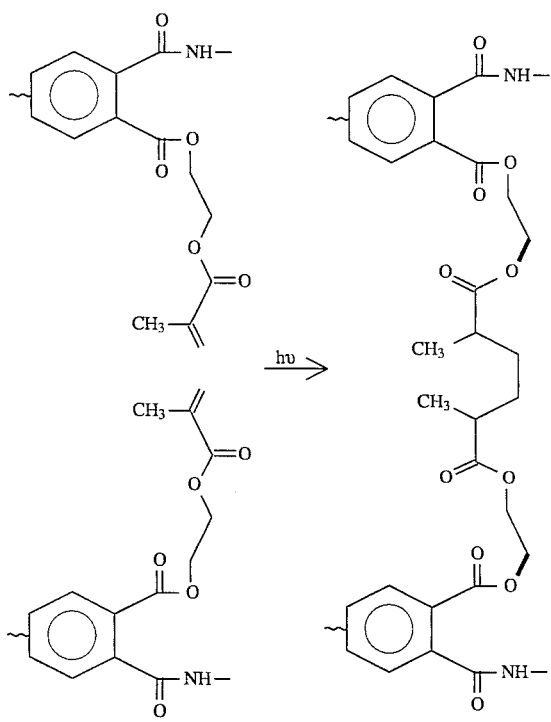

Figure 3:
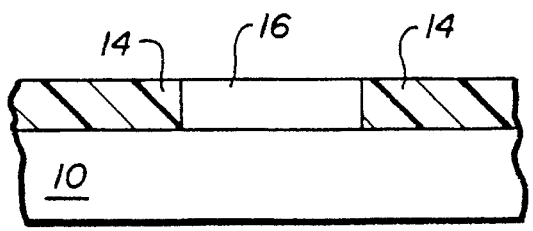

The unexposed portions 12 of the negative polyimide precursor may then be treated so as to prevent or inhibit the cross-linking reaction associated with exposure to radiation. "Inhibiting" the unexposed polyimide precursor refers to a process for modifying the unexposed polyimide precursor or the functionality required for cross-linking, thereby making the polyimide incapable of being cross-linked by exposure to radiation. As shown below (and in reference to FIG. 3), inhibition of the unexposed polyimide layer 12 may be done by altering the double bond functionality responsible for the cross-linking mechanism in order to form an inhibited portion 16 which remains inactive upon exposure to radiation. Again, with reference to Probimide 349, exposure of the uncross-linked polyimide to $I_2$ produces the following reaction:

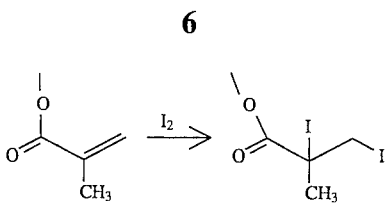

Similarly, exposure of the uncross-linked polyimide to $O_3$ produces the following reaction:

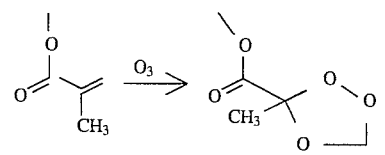

Any reagent that removes (by oxidation, reduction, addition, etc.) the cross-linkable olefinic functionality without damaging the polyimide or polyimide precursor would work. It has been found that the double bond functionality is removed by exposure to ozone gas, iodine vapor or chlorine gas. The necessary amount of exposure to the oxidizing agent will vary with the particular oxidizing agent chosen, the concentration of the same, as well as other factors known to those skilled in the art. For example, the substrate may be exposed to iodine vapor simply by placing iodine crystals in a reaction chamber at ambient temperature and pressure for 15 minutes to 1½ hours. However, it has been discovered that exposure of the uncross-linked portions of the polyimide to the iodine vapor at this concentration for over 2 hours typically results in a slightly inferior film.

Another method of inhibiting the unexposed/uncross-linked portions of the initial polyimide layer is to soak the imaged film in a solution of dye material, such as PAN, [1-(2 pyridylazo)-2-naphthol], in xylene. The dye will penetrate the film and become incorporated into the unexposed/un-cross-linked polyimide layer 16. It is preferable to use a dye such as PAN, which absorbs significant amounts of energy at the irradiating wavelength in order to effectively inhibit and prevent cross-linking caused by exposure to UV radiation. Generally, the substrate may be soaked in the dye for approximately 15 minutes to 2 hours in order to insure sufficient permeation of the dye into the unexposed polyimide precursor. The length of time required for sufficient permeation of the dye will vary with the nature of the dye selected, the polyimide precursor, the thickness of the film and other factors well known to one skilled in the art.

Figure 4:
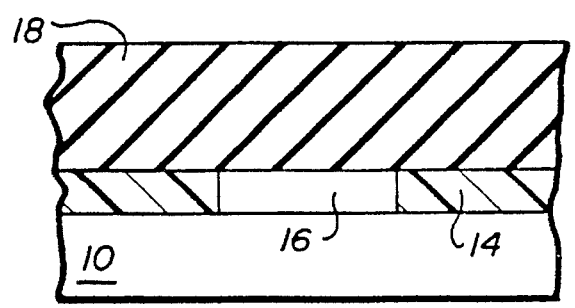
Figure 5:
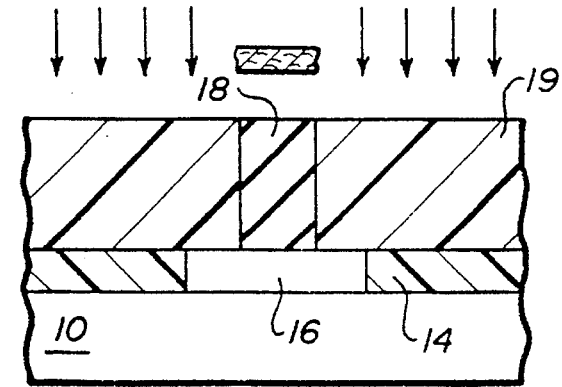

After inhibiting the unexposed portions of the polyimide layer a second layer of negative photosensitive polyimide precursor 18 is similarly applied over the initial polyimide precursor 12 (as seen in FIG. 4). For some purposes the second polyimide layer may be applied at slower spin speeds of 100 to 1000 rpms in order to form a thicker film. In the preferred embodiment the second layer preferably has a thickness of about 50 to 100μ. After deposition of the second negative photosensitive polyimide film it is imagewise exposed, as above, in accordance with the desired pattern. However, as can be seen in reference to FIG. 5, the selected exposure pattern of the second layer overlaps portions of the inhibited portion 16 of the first layer which do not undergo the cross-linking reactions as discussed above. Thus, the inhibited portions 16 of the first polyimide layer, as with the unexposed portion 18 of the second polyimide layer, remain soluble in common developers.

Developer may then be applied by means well known in the art, examples being submersing the substrate in the developer, spray application of the developer, and so forth.

A preferred developer consists of a 50/50 solution of xylene/ butyrolactone and is generally applied for about 4–7 minutes. In general, the development time will depend upon the thickness of the layers, as well as other factors known to those skilled in the art. Application of the developer removes the unexposed portions 18 and the inhibited portions 16 leaving the exposed/cross-linked areas 14, 19 which create a multilayer polyimide structure (an example of such a structure is shown in FIG. 6).

As indicated hereinabove, the formation of these multilayer structures may be extremely effective in forming a pattern of metallization. Although the present invention is discussed herein with reference to a preferred embodiment, so as to more clearly illustrate the invention, it would be readily apparent to those skilled in the art to adapt the present method so as to form lift-off structures having three or more layers. Moreover, this process could be readily adapted so as to utilize a positive photosensitive polyimide as the second layer.

Figure 6:
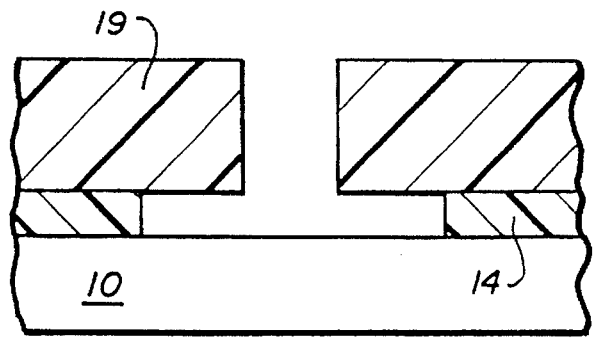
Figure 7:
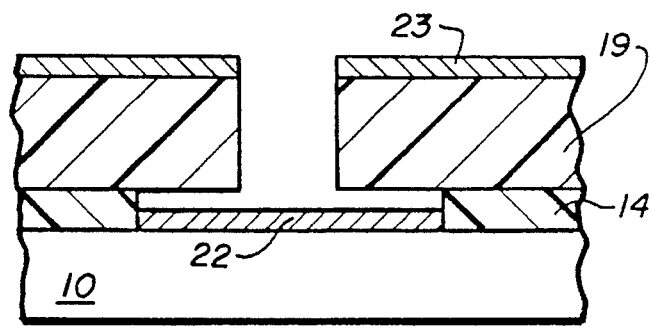

A multi-layer polyimide structure found to be particularly useful is shown in FIG. 6, where the second polyimide layer overhangs a cavity created in the developed initial polyimide layer, thereby forming an inverted "T" shape, having an undercut region 20 and a column type region 21. After development a baking step is generally performed in order to drive off the developer, preferably at a temperature at least 10° C. in excess of that which conductive material is to be deposited. It is important to note, however, that temperatures should not be utilized which fully imidize the polyimide precursors since this may render the polyimide structures insoluble in common solvents. The length and temperature of baking will ultimately depend on several factors, including the type of polyimide used, the type of heating element used to heat the substrate and other factors known to one skilled in the art. Preferably, when using Probimide 349 the substrate is heated to temperatures between 150°–175° C. and allowed to remain at this temperature for 3 to 10 minutes.

A film of conductive material may then be formed on the remaining polyimide structures and the uncovered portions of the substrate 10. Preferably, the film of conductive material is a metal film which is deposited by evaporation in a temperature in the range to 175° C., more preferably in a range up to about 165° C. In a preferred embodiment, an initial amount of conductive material, for example, chromium/copper/gold, is initially deposited by evaporation, electroplating or other means known in the art such that it forms a thin layer 22 across the exposed substrate 10 within the undercut 20 such that it does not rise to a height which allows it to contact the second layer 19 or fill the column 21, for example a deposition of approximately 2μ of conductive material may be initially deposited within the undercut region. The evaporator is preferably set up and angled so that the conductive material is deposited evenly across the exposed substrate in the undercut, thereby forming a "button" shaped layer. In the preferred embodiment a second layer of conductive material, for example lead/tin, is deposited by evaporation. However, it is preferred that the evaporator for the second deposition be angled and set up such that the conductive material is deposited so as to form a substantially column shaped conductive layer 24. Preferably, this column shaped conductive layer 24 is about 50 to 100μ thick. The evaporation techniques discussed above are known in the art and references describing the same include R. Geffken, J. Ryan and G. Slusser, "Contact Metallurgy Development for VLSI Logic" *IBM Journal of Research & Development*, 31, 606–616 (1987), and L. Maissel and R. Glang, *Handbook of Thin Film Technology*, Ch. 1 (1970).

Figure 8:
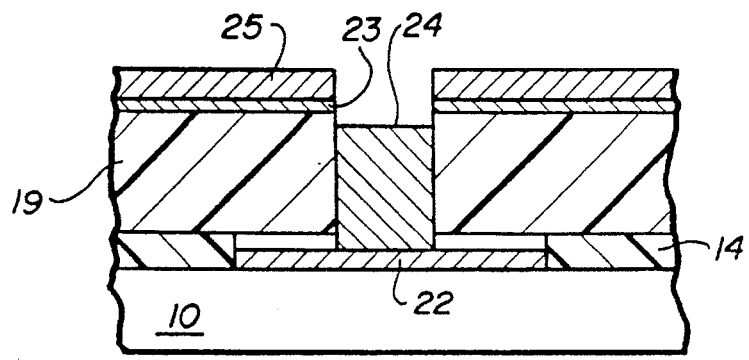
Figure 9:
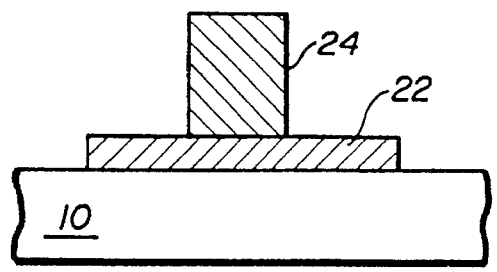

As shown in reference to FIGS. 8 & 9, after the desired metal depositions, remaining portions of the polyimide layers 14, 19 and the portions of the conductive film 23, 25 which overlie the remaining polyimide structure are lifted off the substrate thereby leaving the metal structures formed within the undercut and column regions. Removal of the polyimide structures may be accomplished by any one of numerous methods known in the art. An example being immersion of the substrate in a solvent, such as N-methyl pyrrolidone (NMP) at about 70°–90° C. for about 1–3 hours. Immersion in NMP is preferably accompanied by agitation, such as $N_2$ bubbling. However, in the preferred embodiment, the conductive material upon the polyimide structures is first removed by application of a tape, an example being tape No. 850 which is sold and manufactured by the 3M Corporation of Minneapolis, Minn., followed by removal of the polyimide structures and any remaining conductive material thereon by application of hot NMP.

Figure 10:
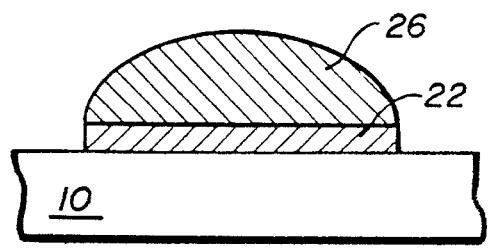

After removal of the polyimide structure, the substrate is heated to a temperature sufficient to melt the column shaped conductive layer 24, such as 365° C. to 390° C. Due to wetting between the thin layer of Cr/Cu/Ag and the Pb/Sn the Pb/Sn will remain upon the Cr/Cu/Ag film and form a substantially rounded shape as shown in FIG. 10.

EXAMPLE 1

A semiconductor structure was fabricated by spin application (dynamic apply 15 s/500 rpm 15 s/3500 rpm–30 s/6000 rpm) of a negative photosensitive polyimide precursor ("PROBIMIDE" 349), followed by baking for 30 minutes by ramping the temperature to 110° C. (80°–80°–80°–110°–110°–110°–110° C. /30 total minutes), thereby forming a polyimide layer approximately 2μ thick. The "PROBIMIDE" 349 material was then exposed to a dose of 360 mJ/cm$^2$ at 438 nm using a mercury lamp (G-line stepper 200 ms at −2.8 focus) leaving unexposed a circular region having a radius of approximately 100μ. The substrate was then placed in a chamber with iodine crystals at ambient temperature and atmospheric pressure for 30 minutes and then removed. A second application of negative photosensitive polyimide precursor ("PROBIMIDE" 349) was spin applied (dynamic apply 15 s/500rpm–5 s/400 rpm–45 s/200 rpm) and baked to 110° C. for 30 minutes (80°–80°–80°–110°–110°–110°– 110° C./30 total minutes). The substrate and the multiple layers of polyimide were again exposed to UV radiation as above, leaving unexposed a circular pattern of radius of approximately 75μ substantially centered over the previous unexposed region. The polyimide films were then developed by spray application of a 50/50 solution of gamma butyrolactone/xylene for 120 seconds, followed by an initial rinse with gamma butyrolactone/xylene for 30 seconds and a second rinse for 10 seconds with xylene. The substrate was then baked on a hot plate for 10 min. at 165° C. An initial layer of metal, namely Cr/Cu/Ag, was deposited by evaporation in a vacuum chamber so as to form a thin film of about 2.5μ upon the exposed substrate within the undercut region within the polyimide structure. The substrate was removed and placed in a second evacuator where a second layer of metal, namely Pb/Sn, was deposited by evaporation forming a substantially column shaped structure about 50μ thick within the undercut and column regions of the polyimide structure. The metal layers upon the polyimide structure were substantially removed by application of 3M tape No. 850 followed by lifting off of the polyimide layer and metal remaining thereon by immersing the substrate in hot NMP at about 80° C. for 1 hour. The substrate was then placed in a H$_2$ reflow furnace at 375° C. for 10–20 minutes wherein the Pb/Sn layer melts and conforms to the thin layer-of Cr/Cu/Ag.

While the present invention has been particularly shown and described with reference to preferred embodiments thereof, it will be understood to those skilled in the are that various changes in form and details may be made therein without departing from the spirit and the scope of the invention.

What is claimed is:

1. A process for forming a multilayer polyimide structure comprising:

applying a first layer of negative photosensitive polyimide precursor on a substrate;

imagewise exposing said first layer;

inhibiting the photosensitivity of the unexposed portions of said first layer;

applying a second layer of photosensitive polyimide precursor over said first layer;

imagewise exposing said second layer, wherein an uncross-linked area of said second layer at least partially overlaps the inhibited portion of said first layer; and developing said first and second layers, thereby forming a multilayer polyimide structure.

2. The process of claim 1 wherein inhibiting said unexposed portion of said first layer comprises incorporating a dye into said unexposed portions of said first layer.

3. The process of claim 2 wherein said dye comprises 1-(2 pyridylazo)-2-naphthol.

4. The process of claim 1 wherein inhibiting the unexposed portions of said first layer comprises exposing said first layer to a oxidizing agent, wherein the double bond functionality responsible for cross-linking is altered.

5. The method of claim 4 wherein said oxidizing agent comprises a halogen.

6. The process of claim 5 wherein said halogen is selected from the group consisting of chlorine and iodine.

7. The process of claim 6 wherein said halogen comprises iodine vapor.

8. The process of claim 5 wherein said oxidizing agent comprises ozone.

9. The method of claim 1 wherein said second layer comprises a negative photosensitive polyimide.

10. The method of claim 9 wherein said first layer and second layer are imagewise exposed wherein the unexposed portions of said first layer are larger than the unexposed portions of said second layer.

11. The process of claim 9 wherein said first and second layers are imagewise exposed wherein the inhibited portion of said first layer and the uncross-linked portion of said second layer are circular in shape and the cross-linked portion of said second layer substantially overlaps the inhibited portion of said first layer.

12. The method of claim 1 wherein developing said first and second layers comprises applying a solution of xylene/butyrolactone to said substrate.

13. The method of claim 1 wherein said first layer comprises a polyamic acrylate ester.

14. A method for forming a pattern of conductive material on a processed semiconductor substrate, comprising:

applying a first layer of negative photosensitive precursor over said substrate, wherein said precursor is a material which fully imidizes at a temperature in excess of the temperature at which said conductive material is to be applied;

imagewise exposing said first layer;

inhibiting the photosensitivity of the unexposed portion of said first layer;

applying a second layer of photosensitive polyimide precursor over said first layer;

imagewise exposing said second layer, wherein the uncross-linked portion of said second layer at least partially overlaps said inhibited portion of said first layer;

developing said uncross-linked portions of said second layer and said inhibited portions of said first layer thereby forming a void in said first and second layers;

depositing a conductive material within said void; and lifting off said first and second layers.

15. The method of claim 14 wherein said first and second layers are imagewise exposed so as to form an undercut region in said void.

16. The method of claim 15 wherein said conductive material deposited within said void is deposited so as to form a thin layer whose thickness is less than 10% of the depth of the void.

17. The method of claim 16 wherein said conductive material is selected from the group consisting of chromium, copper, gold and combinations thereof.

18. The method of claim 17 wherein said conductive material comprises chromium, copper and gold.

19. The method of claim 16 whereby said second layer is imagewise exposed so as to form a void having a column shaped region connected to said undercut region.

20. The method of claim 14 further comprising depositing a second conductive material within said void prior to lifting off said first and second layers.

21. The method of claim 20 further comprising depositing a second conductive material within said void prior to lifting off said first and second layers whereby said deposited second conductive material is substantially column shaped.

22. The method of claim 21 wherein said second conductive layer comprises Pb and Sn.

23. The method of claim 14 wherein lifting off said first and second layers comprises application of N-methyl pyrrolidone.

24. The method of claim 23 wherein, prior to lifting off said first and second layers, placing acrylic adhesive of a tape in contact with the conductive material over said second layer and then removing said tape.

25. The method of claim 14 wherein prior to depositing said conductive material the substrate is baked at a temperature at least 10° C. in excess of the temperature at which the conductive material is deposited but below a temperature which fully imidizes the polyimide precursor.

* * * * *